(12) United States Patent
Aviram et al.

(10) Patent No.: US 6,280,908 B1
(45) Date of Patent: Aug. 28, 2001

(54) POST-DEVELOPMENT RESIST HARDENING BY VAPOR SILYLATION

(75) Inventors: Ari Aviram, Croton on Hudson; Michael Joseph Rooks, Briarcliff Manor, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/292,727

(22) Filed: Apr. 15, 1999

(51) Int. Cl.⁷ ........................................ G03F 7/26
(52) U.S. Cl. ............................. 430/314; 430/324
(58) Field of Search .................... 430/313, 314, 430/315, 323, 324, 325, 329, 270.1

(56) References Cited

U.S. PATENT DOCUMENTS 5,756,255 * 5/1998 Sato .................................. 430/270.1
6,063,543 * 5/2000 Hien .................................. 430/270.1

OTHER PUBLICATIONS

M. Bottcher, et al., "Surface Imaging by Silylation for Low Voltage Electron–Beam Lithography," J. Vac. Sci. Technol. B vol. 12, No. 6, pp. 3473–3477 (1994).

M. Irmscher, et al. "Comparative Evaluation of Chemically Amplified Resists for Electron–Beam Top Surface Imaging Use," J. Vac. Sci. Technol. B, vol. 12, No. 6, pp. 3925–3929 (1994).

M.A. McCord, "Chapter 2 Electron Beam Lithography," Handbook of Microlithography, Micromachining and Microfabrication vol. 1: Microlithography, P. Rai–Choudhury, ed. SPIE Optical Engineering Press, Bellinham WA (1997).

* cited by examiner

*Primary Examiner*—Kathleen Duda
(74) *Attorney, Agent, or Firm*—Scully, Scott, Murphy & Presser; Casey P. August

(57) ABSTRACT

A method of improving the etch resistance of a patterned imageable resist prior to patterning an underlying substrate layer is provided. Specifically, the method employed by the present invention comprises applying a layer of an imageable resist to a substrate layer; patterning the layer of imageable resist by removing selective areas thereof; and treating the patterned imageable resist with an atmosphere comprising molecules of a hardening agent so as to obtain a hardened resist surface which etches at a slower rate than that of the untreated resist.

20 Claims, 2 Drawing Sheets

POST-DEVELOPMENT RESIST HARDENING BY VAPOR SILYLATION

FIELD OF THE INVENTION

The present invention provides a method of decreasing the etch rate of a patterned resist on a substrate by treating the patterned resist with an atmosphere comprising molecules of a hardening agent. By incorporating the molecules of the hardening agent into the resist after exposure and development, but prior to substrate etching, the resist structure or pattern remains unchanged. Extensive optimization of resolution and resist contrast is thereby decoupled from the etching process leading to a more efficient development of new materials for lithography.

BACKGROUND OF THE INVENTION

In the field of semiconductor manufacturing, lithography is generally employed to provide a pattern to a substrate layer. Specifically, an imageable resist is applied to the substrate needing patterning, the imageable resist is then patterned through exposure and development, and the pattern is transferred to the underlying substrate by etching with a plasma of various reactive ion species, e.g. $CF_4$.

Since the etch rate of most imageable resist films is greater than that of the underlying substrate layer, the imageable resist etches laterally at a much faster rate than the underlying substrate layer. This lateral etching of the imageable resist severely distorts the pattern formed in the substrate layer and prevents the formation of a desired, small feature sized pattern (100 nm or less) on the substrate layer.

Numerous attempts to overcome this problem have been developed and are now in use. One solution to this problem is to change the imageable resist's resistance to oxygen plasma by using a silylation technique. In accordance with prior art silylation techniques, the imageable resist is silylated before the film is patterned. Such silylating techniques are disclosed, for example, in M. Bottcher, et al. "Surface Imaging by Silylation for Low Voltage Electron-beam Lithography", J. Vac. Sci. Technol. B12, 3473 (1994); C. Pierrat, et al. "PRIME Process for Deep UV and E-beam Lithography", Microelectronic Engineering, Vol. 11, 507 (1990); and M. Irmscher, et al. "Comparative Evaluation of Chemically Amplified Resists for Electron-beam Top Surface Imaging Use", J. Vac. Sci. Technol. B12, 3925 (1994).

Despite being successful in altering the etch rate of the imageable resist, this prior art method requires that changes be made in the resist chemistry and thus the exposure and development process. Such changes are not desirable since they introduce additional materials not typically employed in lithography.

Alternative solutions to this problem are even more complex involving, for example, resist films made from multiple layers of various polymers. The use of multipolymer film layers is disclosed, for example, in M. A. McCord, et al., "Electron Beam Lithography", Chapter 2 of Handbook of Microlithography, Micromachining and Microfabrication, Vol. 1: Microlithography, P. Rai-Choudhury, ed., SPIE Optical Engineering Press, Bellingham, Wash. (1997). Alternatively, resist polymers can be modified to include alicyclic compounds. These compounds increase etch resistance, but they also change the exposure and development properties of the film (R. D. Allen, et al., "Deep-UV Resist Technology", Chapter 4, ibid.).

There is thus a need for developing a new and improved lithography method which can change the etch resistance of the imageable resist without altering any of the resist chemistry. There is also a need for developing a method which could shift the photolithography industry away from complex and expensive multilayer techniques, and perhaps streamline microelectronic fabrication research by decoupling etching properties from exposure properties.

SUMMARY OF THE INVENTION

One object of the present invention is to provide a method of changing the etch resistance of an imageable resist so that the resist etches slower than any untreated resist layer.

A further object of the present invention is to provide a method of changing the etch rate of an imageable resist in such a fashion that the chemistry of the resist is unaltered and thus no changes in the exposure/development steps are needed.

A still further object of the present invention is to provide a method of improving the etch resistance of the imageable resist so that a reliable pattern having a substantially small feature size can be transferred to the underlying substrate layer.

These and other objects and advantages can be achieved in the present invention by treating a patterned layer of an imageable resist with an atmosphere containing a hardening agent, e.g. metalloid-containing compound, after the patterning step, but prior to etching. Specifically, the method of the present invention comprises the steps of:

(a) applying a layer of an imageable resist to a substrate layer;

(b) patterning the layer of imageable resist by removing selective areas thereof; and (c) treating the patterned imageable resist with an atmosphere comprising molecules of a hardening agent so as to obtain a hardened resist surface that etches at a slower rate than the untreated resist.

After conducting step (c), the pattern is formed in the substrate layer by conventional etching such as reactive ion etching (RIE) and, thereafter the resist can be removed using conventional stripping techniques.

DETAILED DESCRIPTION OF THE INVENTION

Figure 1A:
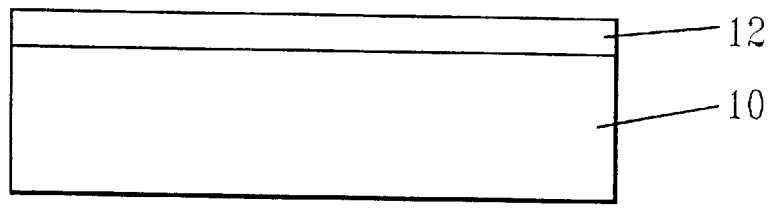
FIGS. 1(a)–(f) illustrate the various processing steps that are employed in one embodiment of the present invention.

The present invention, which provides a method of improving the etch resistance of a patterned imageable resist, will now be described in greater detail by referring to the drawings that accompany the present application. It is noted that in the drawings like and/or corresponding elements are referred to by like reference numerals.

As stated above, the present invention provides a method for improving the etch resistance of a patterned imageable resist whereby the etch resistance is improved by treating the imageable resist with a hardening agent after the imageable resist has been patterned, but prior to etching the underlying substrate layer.

Referring to FIGS. 1(a)–(f) there is shown one embodiment of the method of the present invention wherein a positive tone imageable resist is employed. Although illustration is shown for a positive tone imageable resist, the present invention works well with negative tone imageable resists. Where a positive tone resist is employed, the exposure of the imageable resist renders the exposed areas more soluble than the unexposed areas. The exposed areas are then removed in the development step and the pattern is formed. Where a negative tone resist is employed, the unexposed areas of the resist are removed in the development step.

FIG. 1(a) shows a structure which comprises a substrate layer 10 and a layer of an imageable resist 12 formed thereon. Examples of suitable substrates that can be employed in the present invention include, but are not limited to: semiconductor chips and wafers, circuit boards, interconnect structures, metals, inorganic dielectric materials such as $SiO_2$ and $Si_3N_4$ and other like substrates. Preferably, the substrate is composed of, or contains, a semiconducting material such as Si, Ge, GeSi, GaAs, InAs, INP and other III/V compounds. The semiconducting material may be doped, undoped or contain regions of both therein. The substrate may contain active device regions or wiring regions such as are typically found in integrated circuits. For clarity, such device or wiring regions are not shown in the drawings, but nevertheless, may be present in substrates used in the method of the present invention.

It is noted that the substrate layer may be composed of two or more of the above mentioned materials. For example, substrate layer 10 can be comprised of a Si wafer having $SiO_2$ or a metal formed therein.

The imageable resist is formed on top of substrate layer 10 using conventional deposition processes or growing techniques that are well known to those skilled in the art. Examples of conventional deposition processes that can be used in the present invention include, but are not limited to: chemical vapor deposition (CVD), plasma vapor deposition, sputtering, spin coating and other like deposition techniques.

The thickness of the imageable resist layer is determined by the etch selectivity and the thickness of the underlying substrate layer. The resist layer thickness is typically of from about 1000 to about 10,000 Å, with preferred thicknesses being from about 2000 to about 9500 Å.

The imageable resist employed in the present invention is any resist that is sensitive to radiation. Such resists are well known to those skilled in the art; therefore an exhaustive list is not believed to be needed herein. Preferably, the imageable resist is a resist composition that includes at least a base polymer resin which undergoes chemical changes when subjected to radiation. These chemical changes alter the solubility of the exposed regions such that the desired pattern can be obtained after development with appropriate solvents. In the case of positive tone resists, the exposed regions are removed by the developer solvent, whereas for negative tone resists, the unexposed areas are removed.

Other components that may be present in the resist include: a solvent, a photoacid or photobase generator, a crosslinking agent, an acid or a base, a photosensitizer or a surfactant. The solvents, photoacid/photobase generators, acid or base additives, photosentizers and surfactants employed in the imageable resist are selected from conventional compounds that are well known to those skilled in the art; therefore a detailed description of those components is not given herein. It should be noted that the solvent may be present in the resist composition on application to the substrate layer, but it is typically removed from the applied resist before radiation exposure.

The imageable resist employed in the present method is preferably a chemically amplified resist. Other resists are also contemplated herein. The term "chemically amplified resist" is used herein to denote a resist wherein radiation exposure of the resist generates a catalyst that catalyzes a cascade of chemical transformations (with or without subsequent heating) to change the solubility of the exposed regions. Preferably, the chemically amplified resist employed in the present invention comprises a polymer resin which contains acid-sensitive or base-sensitive protecting groups (i.e. positive tone resists) or a crosslinking functionality (negative tone resists). Typical chemical amplified resists are acid or base catalyzed wherein exposure of the resist to radiation generates a strong acid or base that catalyzes the deprotection (or crosslinking in the case of negative tone resists) of the base polymer resin. Subsequent development with an appropriate solvent generates the desired patterned resist.

Positive tone resists useful in the present invention preferably contain a base polymer resin derived from at least one of the following: novolak, hydroxystyrene, acrylates, methacrylates, acrylamides, methacrylamides, itaconates, itaconic half esters and cycloolefins. The base polymer resin may be a homopolymer, a copolymer or a higher polymeric entity. When used as copolymers or higher polymers, monomers such as styrene, hydroxystyrene, acrylic acid, methacrylic acid, itaconic acid and an anhydride such as maleic anhydride and itaconic anhydride may be used. The positive tone resist can be fully or partially protected with an acid-sensitive or base-sensitive protecting group, such as those known in the art.

Preferred negative tone resists contain a base polymer resin that is capable of being crosslinked. Examples of crosslinkable polymers include: methyl-acetoxy calixarene and hydroxystyrene; whereas examples of crosslinking agents include: melamines and urils.

After forming the imageable resist on the surface of the substrate layer, the imageable resist is patterned. Specifically, the imageable resist is patterned using a two step process which includes exposure and development. A pre-baking step may be optionally employed as well as a post-baking step.

When the optional pre-baking step is employed in the present invention, it occurs prior to exposure. This step is desirable if the imageable resist has a solvent content above 5%. When a pre-bake step is employed, the structure shown in FIG. 1(a) is baked, i.e. heated, to a temperature of from about 60° C. to about 250° C. for a time period of from about 30 to about 300 seconds. More preferably, the optional pre-bake step is carried out at a temperature of from about 100° to about 200° C. for a time period of from about 60 to about 290 seconds.

The unbaked or pre-baked imageable resist layer is then pattern-wise exposed to radiation using a masked or maskless lithographic process. The exposure process may be carried out using mid-UV, deep-UV (243, 193, 157 and 129 nm), extreme-UV, e-beam, x-ray or ion beam radiation or maskless scanning probe lithography.

After exposure, the imageable resist may optionally be post-baked at a temperature of from about 60° to about 250° C. for a time period of from about 30 to about 300 seconds. More preferably, the optional post-bake step is carried out at a temperature of from about 100° to about 140° C. for a time period of from about 60 to about 120 seconds. The above post-bake conditions are preferably sufficient to crosslink the imageable resist in the case of negative resist compositions. It is noted that the post-bake step may occur before, during or after exposure of the resist to the hardening agent.

Figure 1B:
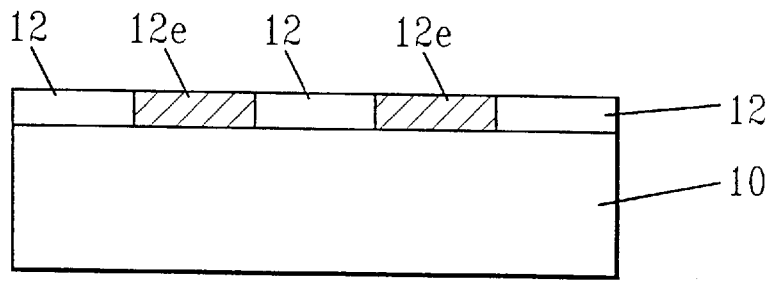

A structure such as shown in FIG. 1(b) is obtained after exposure. This structure contains resist areas 12e that are exposed to radiation and resist areas 12 that are not exposed to radiation. It is noted that in the development step, the pattern may be formed by removing either 12e or 12, wherein e denotes areas exposed to radiation.

Figure 1C:
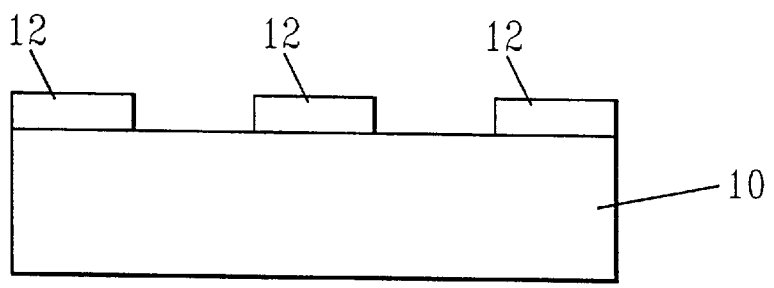

After exposure and any optional post-bake step, the pattern shown in FIG. 1(b) provided by areas 12e or 12 are developed using a suitable solvent. In the positive resist embodiment shown in the figures, the exposed areas 12e are developed, i.e. removed, leaving unexposed areas of imageable resist 12 remaining on the surface of the substrate. Preferred solvents are aqueous alkaline developers such as aqueous tetramethylammonium hydroxide solutions. The resulting patterned resist structure is shown in FIG. 1(c). When a negative tone resist is employed, the unexposed areas 12 of the imageable resist would be removed to obtain the desired patterned resist structure.

Figure 1D:
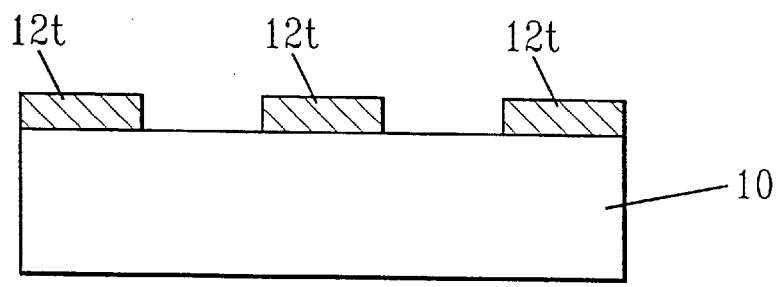

In accordance with the method of the present invention, the patterned resist structure is then treated with molecules of a hardening agent which are capable of improving the etch resistance of the resist. The patterned resist structure after exposure, i.e. treatment, with a hardening agent is shown in FIG. 1(d), wherein the treated resist areas are now designated as 12t.

The term "hardening agent" is used in the present invention to denote a material which is capable of making portions of the imageable resist more etch resistant. That is, the hardening agent employed in the present invention is one that hardens the surface of the imageable resist so that the surface thereof etches at a slower rate than that of the untreated resist.

Suitable hardening agents employed in the present invention are ones which contain at least a metalloid or metallic element selected from Groups IIA, IVB, VIII, IB, IIIA, or IVA of the Periodic Table of Elements (CAS version). Suitable metalloids or metallic elements include, but are not limited to: Mg, Ca, Si, Ge, Sn, Ti, Zr, Fe, Co, Ni, Ru, Rh, Pd, Ir, Pt, Cu, Ag and Au. Alloys of the same are also contemplated herein. The metalloid or metallic element may be in elemental form or it can be present in a compound or complex.

A highly preferred metalloid for use in the present invention is Si. When Si is the molecule to be incorporated into the resist, the hardening agent is a silylating agent such as, but not limited to: silyl amine, hexamethyldisilazane (HMDS), 3-aminopropyl-1-trimethoxy silane, 3-aminopropyl-1-trimethyl silane, trimethylsilyldiethylamine, N,O—bis(trimethylsilyl)sulfamate, isopropyldimethylsilyl ether, t-butyldimethylsilyl chloride, (triphenylmethyl)dimethyl silyl bromide and methyldiisopropylsilyl chloride. Of these silylating agents, HMDS is highly preferred in the present invention.

Molecules of the hardening agent are incorporated into the remaining portions of the patterned resist using a vapor of the hardening agent provided by pyrolysis. Specifically, when Si is to be incorporated into the resist, one of the above mentioned silylating agent is selected and incorporation occurs using conventional silylation techniques well known to those skilled in the art. For example, silylation may occur by providing a vapor of the silylating by way of pyrolyzing the hardening agent. Pyrolysis typically occurs at a temperature of from about 100° to about 300° C. The amount of hardening agent incorporated into the imageable resist is preferably greater than about 1 wt. %, more preferably, greater than 10 wt. %. Preferably, from about 1 to about 25 wt. % of said hardening agent is incorporated into the resist.

After the hardening agent has been incorporated into the remaining portions of the resist, the exposed portions of the substrate layer are then patterned using conventional dry etching techniques which generally utilize a plasma containing a reactive ion species such as oxygen, fluorine, chlorine and bromine. Exemplary dry etching techniques that can be used to etch the substrate layer include: reactive ion etching (RIE), plasma etching and ion-beam etching. A highly preferred means for etching the exposed portions of the substrate layer is by way of RIE using $CF_4$ gas as the reactive ion gas.

Figure 1E:
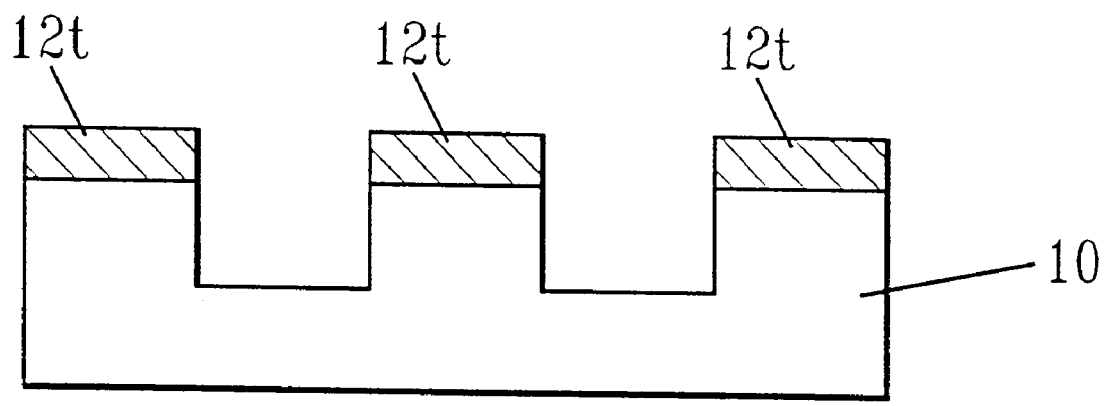

The etching step of the present invention provides a pattern to the underlying substrate layer. Such a patterned structure is shown in FIG. 1(e) of the present invention.

Figure 1F:
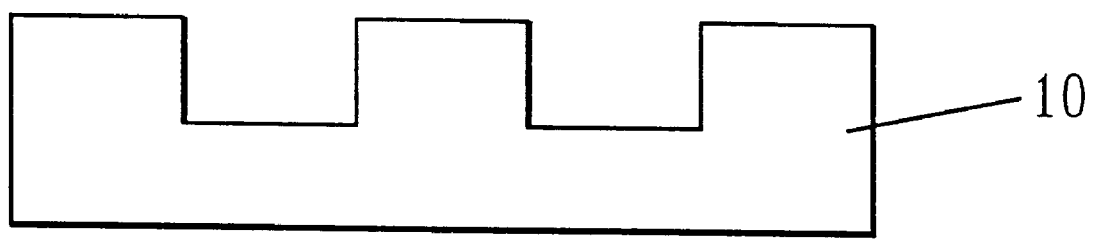

After patterning the substrate layer, the remaining imageable resist layer that is treated with the hardening agent (12t) may be removed using standard stripping techniques well known to those skilled in the art. For example, oxygen RIE (reactive ion etching) can be employed in the present invention to remove the remaining treated areas of the imageable resist. The final structure is shown in FIG. 1(f).

It is noted that the shape of the actual pattern may vary depending on the type of device being manufactured. Exemplary patterns include: trenches, contact holes, vias, shallow trench isolation regions, gate stacks and other like patterns. It is noted that since the present invention improves the etch resistance of the resist without changing the resist chemistry, one can use the same for providing small feature sized patterns to the substrate layer. Moreover, the method of the present invention allows for more accurate pattern transfer than heretofore possible with prior art lithography methods.

The following example is given to illustrate the scope and spirit of the present invention. Because this example is given for illustrative purposes only, the invention embodied therein should not be limited thereto.

EXAMPLE 1

In this example, methyl-acetoxy calixarene (MAC) was employed as the imageable resist and HMDS was used as the hardening agent. Specifically, a thin (0.1 $\mu$m) of MAC was patterned by exposure to electrons and subsequently developed in xylene. The patterned wafer was then baked at 200° C. for 40 minutes in an atmosphere of HMDS. The HMDS-treated film had an etch rate in $CF_4$ plasma which was 40% lower than untreated MAC films. More importantly, the pattern remained unaltered by the hardening process of the present invention. TEM (transmission electron microscopy) photographs show patterns in MAC which are unchanged even for features on the 20 nm scale. Moreover, films and patterns in MAC resist do not swell or shrink when subjected to the hardening process of the present invention.

While the present invention has been particularly shown and described with respect to preferred embodiments thereof, it will be understood by those skilled in the art that the foregoing and other changes in form and details may be made therein without departing from the spirit and scope of the invention. It is therefore intended that the present invention not be limited to the exact forms described and illustrated, but fall within the scope of the appended claims.

What is claimed is:

1. A method of improving the etch resistance of a patterned resist prior to patterning an underlying substrate layer, said method comprising the steps of:

(a) applying a layer of an imageable resist to a substrate layer;

(b) patterning the layer of imageable resist by removing selective areas thereof; and (c) treating the patterned resist with an atmosphere comprising molecules of a hardening agent so as to obtain a hardened resist surface that etches at a slower rate than that of the untreated resist, wherein said hardening agent includes a metalloid or metallic element selected from Group IIA, IVB, VIII and IIIA of the Periodic Table of Elements.

2. The method of claim 1 wherein said substrate layer is a semiconductor chip or wafer, a circuit board, an interconnect structure, a metal, an inorganic dielectric material or any combination thereof.

3. The method of claim 2 wherein said inorganic dielectric material is $SiO_2$ or $Si_3N_4$.

4. The method of claim 1 wherein said substrate layer is composed of, or contains, a semiconducting material selected from the group consisting of Si, Ge, GeSi, GaAs, InAs, INP and other III/V compounds.

5. The method of claim 1 wherein said imageable resist is a material which is sensitive to radiation.

6. The method of claim 1 wherein said imageable resist comprises at least a base polymer resin which undergoes chemical changes when exposed to radiation.

7. The method of claim 1 wherein said imageable resist is a positive tone resist.

8. The method of claim 7 wherein said positive tone resist includes an acid-sensitive or base-sensitive protecting group.

9. The method of claim 8 wherein said positive tone resist comprises a base polymer selected from the group consisting of novolak, hydroxystyrene, an acrylate, a methacrylate, an acrylamide, a methacrylamide, an itaconate, an itaconic half ester, a cycloolefin and any combination thereof.

10. The method of claim 9 wherein said positive tone resist further comprises styrene, hydroxystyrene, acrylic acid, methacrylic acid, itaconic acid or an anhydride.

11. The method of claim 1 wherein said imageable resist is a negative tone resist which includes a cross-linkable polymer and a cross-linking agent.

12. The method of claim 1 wherein said imageable resist is applied by chemical vapor deposition, plasma vapor deposition, sputtering or spin coating.

13. The method of claim 1 wherein step (b) includes exposure to radiation and development with a developer solvent.

14. The method of claim 13 wherein step (b) further includes pre-baking, post-baking or both.

15. The method of claim 13 wherein said exposure includes mid-UV, deep-UV, extreme UV, e-beam, x-ray or ion beam radiation or a maskless scanning probe lithography.

16. The method of claim 1 wherein said metalloid or metallic element is Mg, Ca, Ti, Zr, Fe, Co, Ni, Ru, Rh, Pd, Pt, Ir, Cu, As, Au or alloys thereof.

17. The method of claim 1 wherein said molecules of said hardening agent are formed by pyrolysis.

18. The method of claim 1 wherein from about 1 to about 25 wt. % of said hardening agent is incorporated into said resist.

19. The method of claim 1 further comprising etching exposed areas of said substrate layer using a dry etching technique.

20. The method of claim 19 further comprising stripping the resist after etching.

* * * * *